US008617946B2

(12) United States Patent
Liu et al.

(10) Patent No.: US 8,617,946 B2
(45) Date of Patent: Dec. 31, 2013

(54) INTEGRATED CIRCUITS INCLUDING METAL GATES AND FABRICATION METHODS THEREOF

(75) Inventors: Chung-Shi Liu, Shi-Chu (TW); Chen-Hua Yu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 190 days.

(21) Appl. No.: 12/846,474

(22) Filed: Jul. 29, 2010

(65) Prior Publication Data
US 2011/0108922 A1  May 12, 2011

Related U.S. Application Data

(60) Provisional application No. 61/260,183, filed on Nov. 11, 2009.

(51) Int. Cl.
*H01L 21/8238* (2006.01)

(52) U.S. Cl.
USPC ............................ 438/199; 438/218; 438/230

(58) Field of Classification Search
USPC .................. 438/199, 218, 230; 257/E21.632
See application file for complete search history.

(56) References Cited

U.S. PATENT DOCUMENTS

| 7,812,414 B2 * | 10/2010 | Hou et al. ...................... 257/412 |
| 2010/0240204 A1 * | 9/2010 | Yeh et al. ...................... 438/585 |
| 2011/0001194 A1 * | 1/2011 | Hou et al. ...................... 257/369 |
| 2011/0031557 A1 * | 2/2011 | Kirkpatrick et al. .......... 257/369 |
| 2011/0062526 A1 * | 3/2011 | Xu et al. ........................ 257/369 |
| 2011/0081774 A1 * | 4/2011 | Yeh et al. ...................... 438/591 |
| 2011/0097867 A1 * | 4/2011 | Lin et al. ........................ 438/294 |
| 2011/0115028 A1 * | 5/2011 | Datta et al. .................... 257/369 |
| 2012/0018817 A1 * | 1/2012 | Yeh et al. ...................... 257/411 |
| 2012/0190158 A1 * | 7/2012 | Wang et al. ................... 438/199 |
| 2012/0228715 A1 * | 9/2012 | Niimi et al. ................... 257/369 |
| 2012/0256270 A1 * | 10/2012 | Lee et al. ....................... 257/369 |
| 2013/0034946 A1 * | 2/2013 | Chuang et al. ................ 438/382 |

FOREIGN PATENT DOCUMENTS

| CN | 101034717 | 9/2007 |
| CN | 101091244 | 12/2007 |
| CN | 101494199 | 7/2009 |

OTHER PUBLICATIONS

Chang, M. F., et al., "Low-Threshold-Voltage MoN/HfAlO/SiON p-MOSFETs With 0.85-nm EOT", IEEE Electron Device Letters, vol. 30, No. 8, Aug. 2009, pp. 861-863.
Choi, K, et al., "Growth Mechanism of ALD-TiN and the Thickness Dependence of Work Function", IEEE 2005, pp. 103-104.
Vellianitis, G., "Gatestackes for Scalable High-Performance FinFETS", IEEE 2007, pp. 681-684.
Office Action from corresponding application No. CN201010546707.4.

* cited by examiner

*Primary Examiner* — Ngan Ngo
(74) *Attorney, Agent, or Firm* — Lowe Hauptman & Ham, LLP

(57) ABSTRACT

A method of forming an integrated circuit is provided. The method includes forming a gate electrode of an NMOS transistor over a substrate by a gate-first process. A gate electrode of a PMOS transistor is formed over the substrate by a gate-last process.

12 Claims, 19 Drawing Sheets

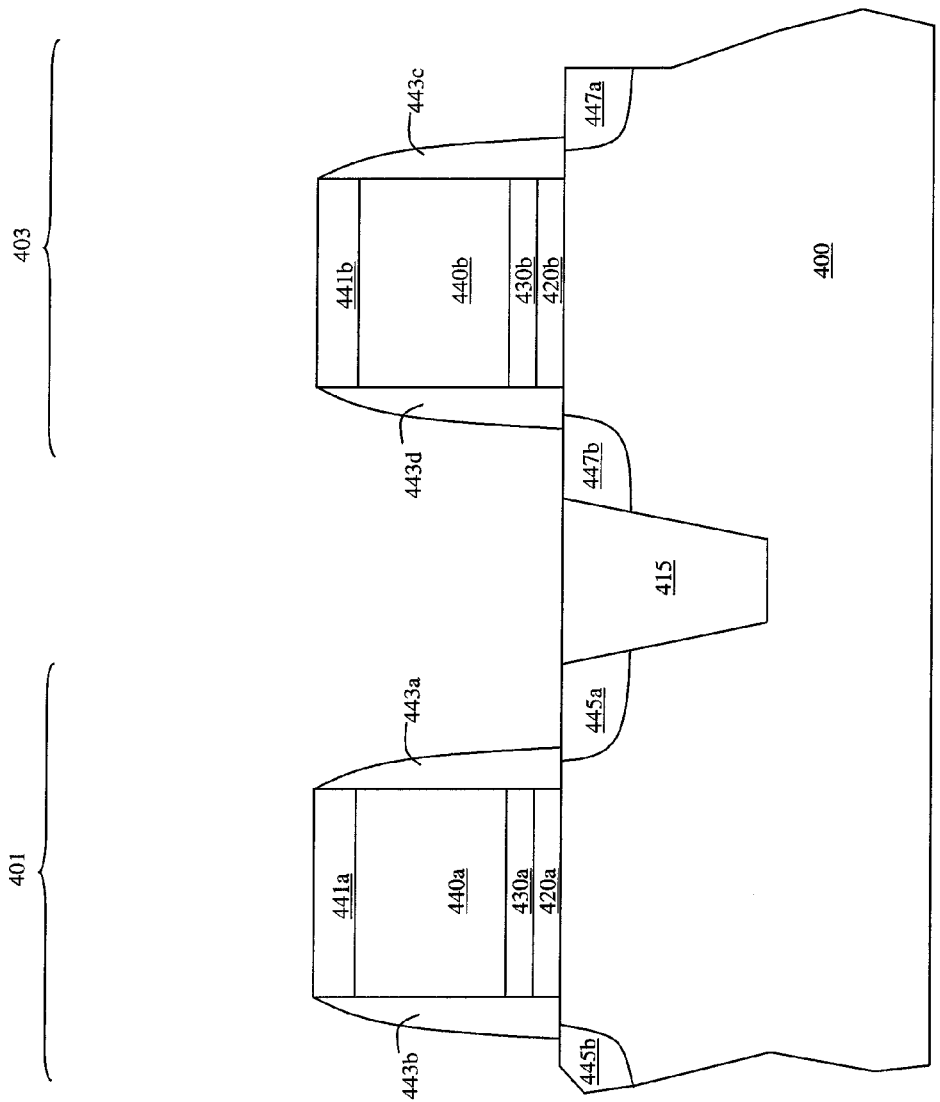

INTEGRATED CIRCUITS INCLUDING METAL GATES AND FABRICATION METHODS THEREOF

CROSS-REFERENCE TO RELATED APPLICATIONS

The present application claims priority of U.S. Provisional Patent Application Ser. No. 61/260,183, filed on Nov. 11, 2009, which is incorporated herein by reference in its entirety.

TECHNICAL FIELD

The present disclosure relates generally to the field of semiconductor devices, and more particularly, to integrated circuits including metal gates and fabrication methods thereof.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. CMOS devices have typically been formed with a gate oxide and polysilicon gate electrode. There has been a desire to replace the gate oxide and polysilicon gate electrode with a high dielectric constant (high-k) gate dielectric and metal gate electrode to improve device performance as feature sizes continue to decrease.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A-4G are schematic cross-sectional views illustrating another exemplary method of forming an integrated circuit.

DETAILED DESCRIPTION

Figure 1:
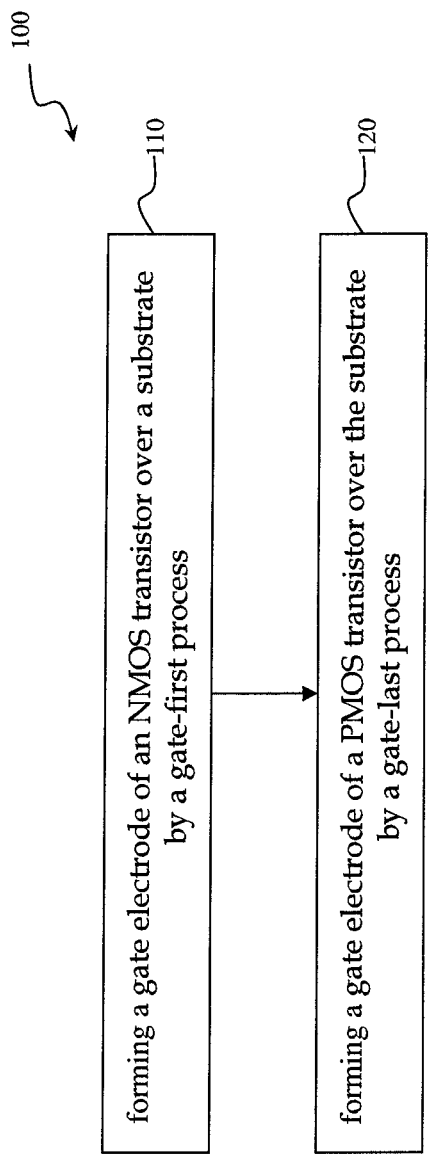
FIG. 1 is a schematic drawing illustrating an exemplary process flow for forming gate electrodes of an NMOS transistor and a PMOS transistor.

Conventionally, metal gate electrodes of both the NMOS transistor and the PMOS transistor of an integrated circuit can be formed by either a gate-first processes or a gate-last processes. For a conventional gate-first process, each of the metal gate electrodes of the NMOS transistor and PMOS transistor can include a silicide layer. The formation of the silicide layer at the top of the metal gate electrodes includes a high-temperature annealing process for silicidation. It is found that the high-temperature annealing process reduces an effective oxide thickness $E_{ot}$ of each of the NMOS transistor and the PMOS transistor. The reduction of the effective oxide thickness $E_{ot}$ reduces work function values of the NMOS transistor and the PMOS transistor. It is also found that the high-temperature annealing process assists an n-type work function metal layer and/or a p-type work function metal layer interacting with a high-k gate dielectric layer. The interaction lowers the work function values of the NMOS transistor and the PMOS transistor.

A conventional gate-last process forms the metal gate electrodes of the NMOS and PMOS transistors after the formation of source/drain regions. For example, the source/drain regions are formed within the substrate and dummy gates of the NMOS and PMOS transistors within an interlayer dielectric (ILD) layer. The dummy gate of the NMOS transistor is removed for forming an opening. An n-type metal gate material for the NMOS transistor is filled in the opening. The n-type metal gate material outside the opening is removed by a chemical-mechanical planarization (CMP) process. After forming the metal gate electrode of the NMOS transistor, the dummy gate of the PMOS transistor is removed for forming another opening. A p-type metal gate material for the PMOS transistor is filled in the opening. The p-type metal gate material outside the opening is removed by another chemical-mechanical planarization (CMP) process. The multiple CMP processes for forming the metal gate electrodes of the NMOS and PMOS transistors increase the cost of fabricating the NMOS transistor and PMOS transistor in the same chip.

Based on the foregoing, methods for forming metal gate electrodes of NMOS transistors and PMOS transistors in the same chip are desired.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic drawing illustrating an exemplary process flow for forming gate electrodes of an NMOS transistor and a PMOS transistor. In FIG. 1, a method 100 for forming metallic gate electrodes of an NMOS transistor and a PMOS transistor can include processes 110 and 120. The process 110 can include forming a gate electrode of the NMOS transistor over a substrate by a gate-first process. The process 120 can include forming a gate electrode of the PMOS transistor over the substrate by a gate-last process.

As noted, the conventional technique uses either the gate-first process or the gate-last process to form the metal gate electrodes of both of the NMOS transistor and the PMOS transistor in a single integrated circuit. For the gate-first process, the high-temperature annealing process reduces the effective oxide thickness $E_{ot}$ of both of the NMOS transistor and the PMOS transistor. The reduction of the effective oxide thickness $E_{ot}$ reduces work function values of the NMOS transistor and the PMOS transistor. The interaction of the work function metal layer with the high-k gate dielectric layer also reduces the work function values. It is also noted that the conventional gate-last process uses multiple-CMP processes that increase the cost of manufacturing the NMOS transistor and PMOS transistor in the single chip.

In contrast, the method 100 can form the gate electrode of the NMOS transistor by a gate-first process and then form the gate electrode of the PMOS transistor by a gate-last process. Since a work function metallic layer for the PMOS transistor is formed after the high-temperature annealing process, the work function metallic layer of the PMOS transistor is free from being affected by the high-temperature annealing process. The work function value of the PMOS transistor is substantially free from being affected by the high-temperature anneal process.

Furthermore, the method 100 uses the gate-first process to form the gate electrode of the NMOS transistor. The gate-first process is free from including a CMP process for removing a work function metallic material and/or a fill-in material for the NMOS transistor. The cost of using the method 100 to fabricate metallic gate electrodes of the NMOS transistors and PMOS transistors can be desirably reduced.

Following are descriptions regarding exemplary processes for forming an integrated circuit. Each of the exemplary processes includes the method 100 described above in conjunction with FIG. 1. Please note that the embodiments described below are merely exemplary. The scope of the invention is not limited thereto.

Figure 2A:
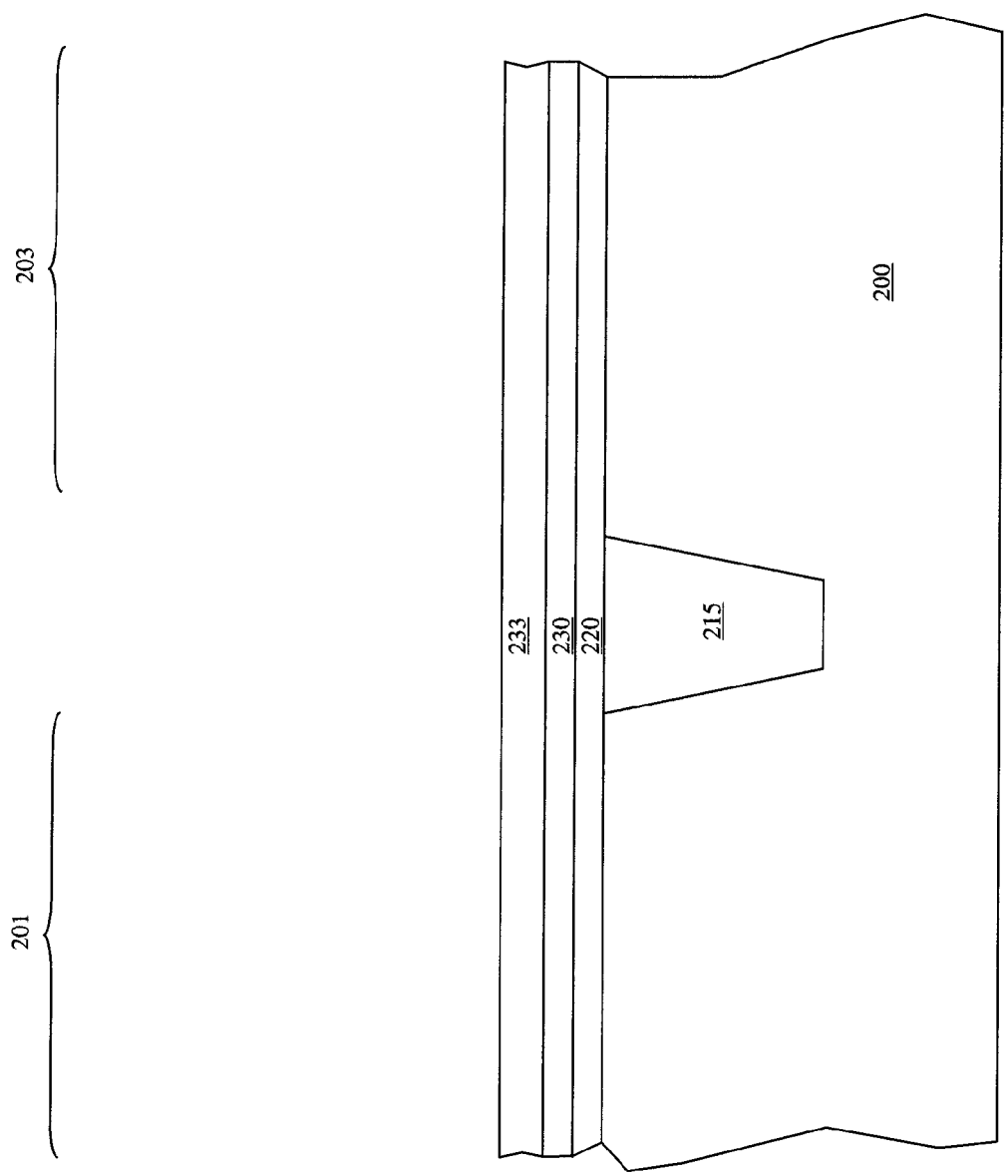
FIGS. 2A-2I are schematic cross-sectional views illustrating an exemplary method of forming an integrated circuit.

FIGS. 2A-2I are schematic cross-sectional views illustrating an exemplary method of forming an integrated circuit. In this embodiment, an n-type ion implantation process is applied to adjust the work function value of an NMOS transistor. In FIG. 2A, an isolation structure 215 can be formed within a substrate 200. The isolation structure 215 can isolate a region 201 for an NMOS transistor from a region 203 for a PMOS transistor. A gate dielectric structure 220, a work function metallic layer 230, and an amorphous silicon layer 233 can be sequentially formed over the substrate 200.

In some embodiments, the substrate 200 can include an elementary semiconductor including silicon or germanium in crystal, polycrystalline, or an amorphous structure; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

The isolation structure 215 can be disposed within the substrate 200. In some embodiments, the isolation structure 215 can be a shallow trench isolation (STI) structure, a local oxidation of silicon (LOCOS) structure, or other isolation structure. The isolation structures 215 can be formed by, for example, a STI process, a LOCOS process, and/or other suitable method for forming isolation structures. As one example, the formation of an STI may include patterning the semiconductor substrate by a conventional photolithography process, etching a trench in the substrate (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

The gate dielectric structure 220 can be formed over the substrate 200. The gate dielectric structure 220 can be a single layer or a multi-layer structure. In some embodiments having a single-layer gate dielectric structure, the gate dielectric structure 220 can include dielectric material such as, silicon oxide, silicon nitride, silicon oxinitride, high-k dielectric material, other dielectric material, and/or the combinations thereof. In some embodiments having a multi-layer gate dielectric structure, the gate dielectric structure 220 can include an interfacial layer and a high-k dielectric layer. The interfacial layer can include dielectric material such as silicon oxide, silicon nitride, silicon oxinitride, other dielectric material, and/or the combinations thereof. The high-k dielectric layer can include high-k dielectric materials such as $HfO_2$, HfSiO, HfSiON, HfTaO, HfSiO, HfZrO, other suitable high-k dielectric materials, and/or combinations thereof. The high-k material may comprise metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof. The gate dielectric structure 220 may be formed by any suitable process, such as atomic layer deposition (ALD), chemical vapor deposition (CVD), wet oxidation, physical vapor deposition (PVD), remote plasma CVD (RPCVD), plasma enhanced CVD (PECVD), metal organic CVD (MOCVD), sputtering, plating, other suitable processes, and/or combinations thereof.

The work function metallic layer 230 can be formed over the gate dielectric structure 220. The work function metallic layer 230 can include materials such as metal, metal carbide, metal nitride, or other materials that can provide a desired work function for transistors. In some embodiments, the work function metallic layer 230 can be an n-type work function metallic layer. The n-type work function metallic layer can include materials such as hafnium, zirconium, titanium, tantalum, aluminum, metal carbides, other n-type metallic material that is capable of modulating the work function value of the gate electrode of the NMOS transistor, or the combinations thereof. The n-type work function material can be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

The amorphous silicon layer 233 can be formed over the work function metallic layer 230. The amorphous silicon layer 233 can desirably prevent a metallic contamination resulting from an ion implantation described below for adjusting the work function value of the NMOS transistor. The amorphous silicon layer 233 may be formed by any suitable process, such as chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

Figure 2B:
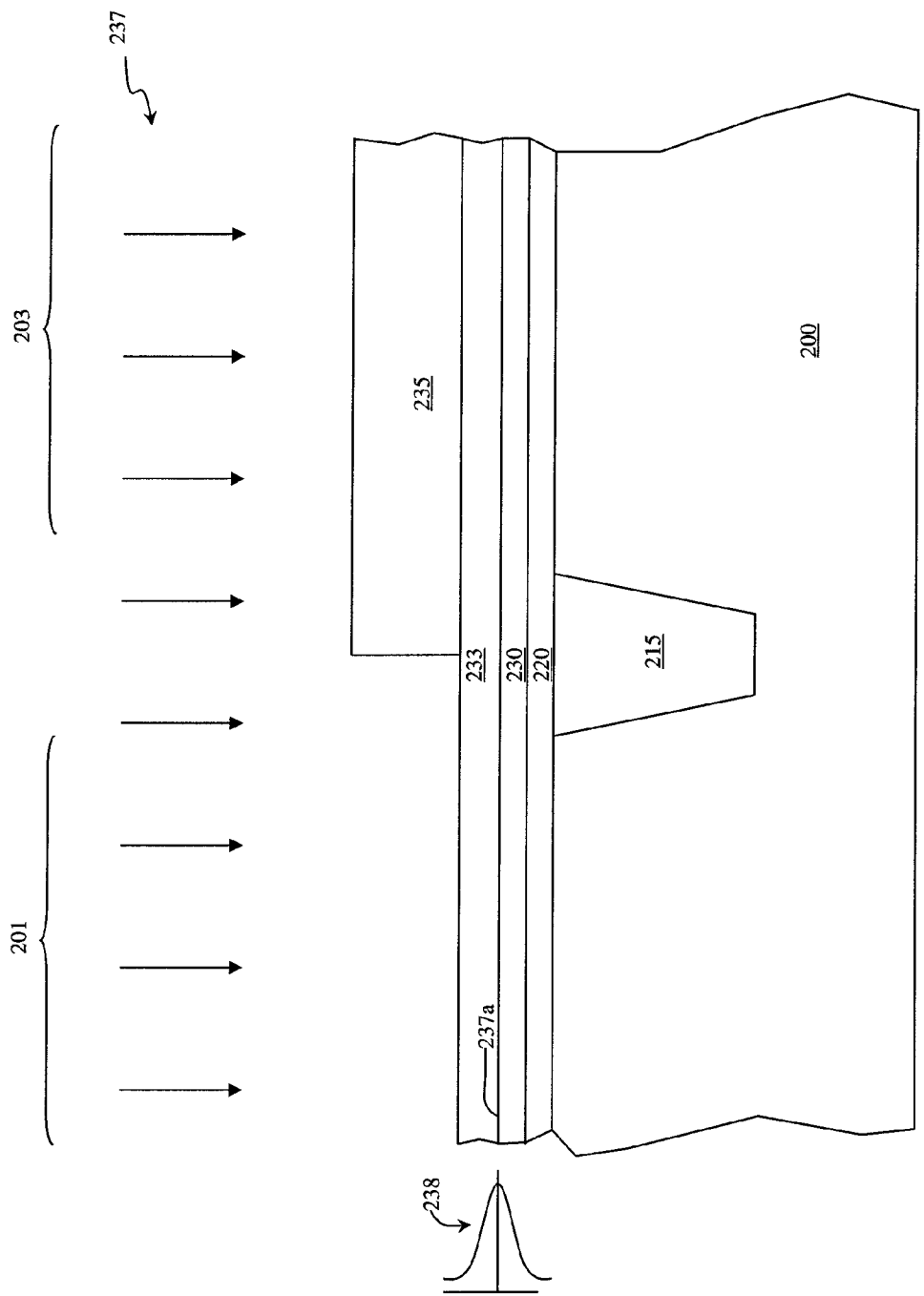

Referring to FIG. 2B, a patterned photoresist (PR) layer 235 can be formed over the amorphous silicon layer 233, covering the region 203 for the PMOS transistor. The patterned PR layer 235 can be used as a mask layer for an ion implantation 237. The ion implantation 237 can implant, e.g., n-type dopants, to an interface 237a between the work function metallic layer 230 and the amorphous silicon layer 233. In some embodiments, the ion implantation 237 can have implantation energy at a level from about 1 KeV to about 9 KeV and have a dopant dosage from about 1E15/cm$^2$ to about 9E15/cm$^2$. In some other embodiments, the ion implantation 237 can have implantation energy at a level of about 6 KeV and have a dopant dosage of about 4E15/cm$^2$.

Referring to FIG. 2B, a peak of a dopant distribution curve 238 can be adjacent to the interface 237a. The n-type dopants can desirably reduce the threshold voltage of the NMOS transistor by, for example, 240 mV or more. In some embodiments, the peak of the dopant distribution curve 238 can be around the interface 237a. In some other embodiments, the peak of the dopant distribution curve 238 can be slightly higher than the interface 237a and in the amorphous silicon layer 233. In still other embodiments, the peak of the dopant distribution curve 238 can be slightly lower than the interface 237a and in the work function metallic layer 230.

Figure 2C:
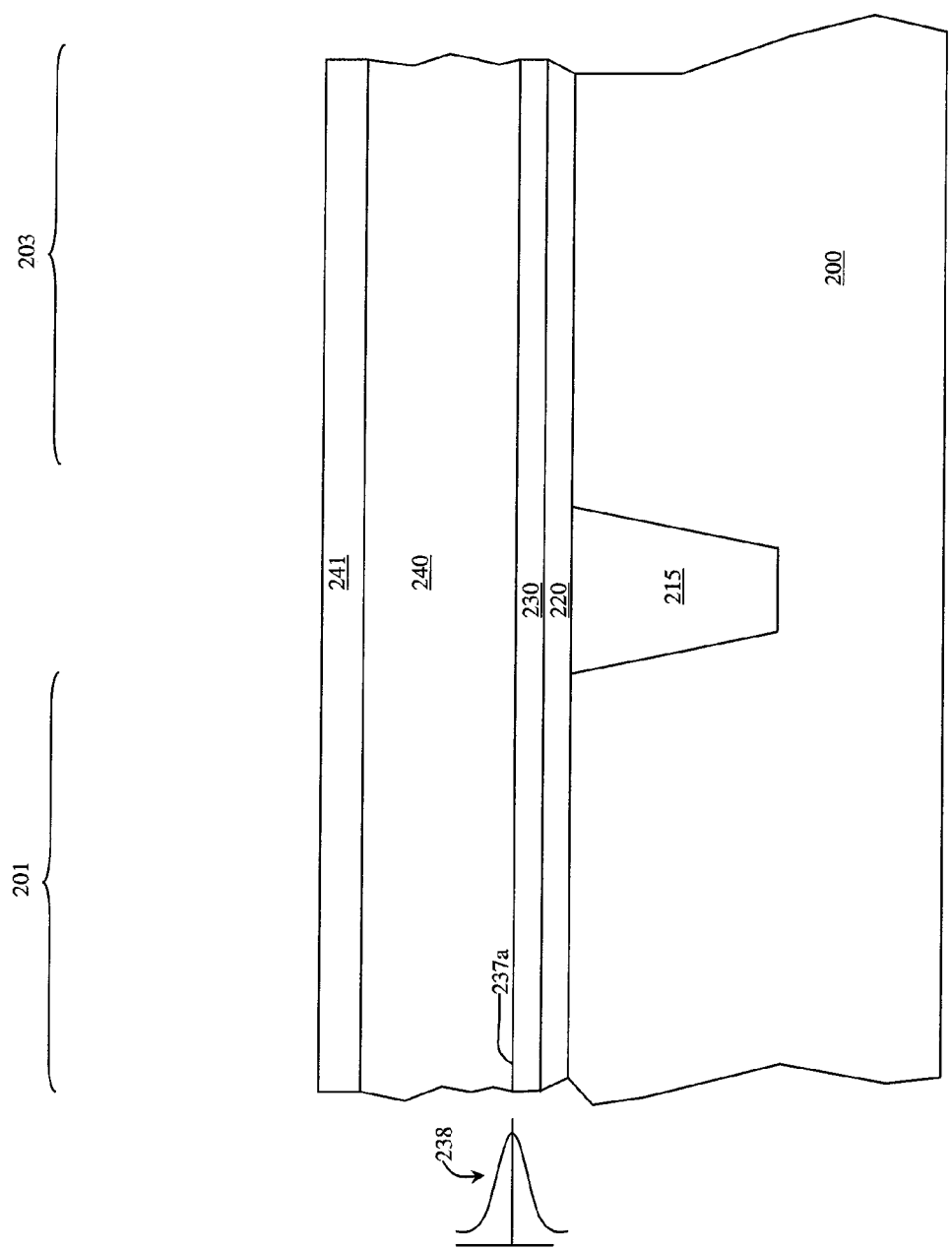

Referring to FIG. 2C, the patterned PR layer 235 (shown in FIG. 2B) is removed. After the removal of the patterned PR layer 235, a silicon layer 240, e.g., a polysilicon layer, can be formed over the work function metallic layer 230. In some embodiment, the thermal energy of the process for forming the silicon layer 240 can convert the amorphous silicon layer 233 (shown in FIG. 2B) to a polysilicon material layer. The polysilicon material layer resulting from the amorphous silicon layer 233 can become a portion of the silicon layer 240. The silicon layer 240 may be formed by any suitable process, such as chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

Referring to FIG. 2C, a hard mask layer 241 can be formed over the silicon layer 240. The hard mask layer 240 can include at least one material such as nitride, oxynitride, other dielectric material, or any combinations thereof. The hard mask layer 240 can be formed by any suitable process, such as chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

Figure 2D:
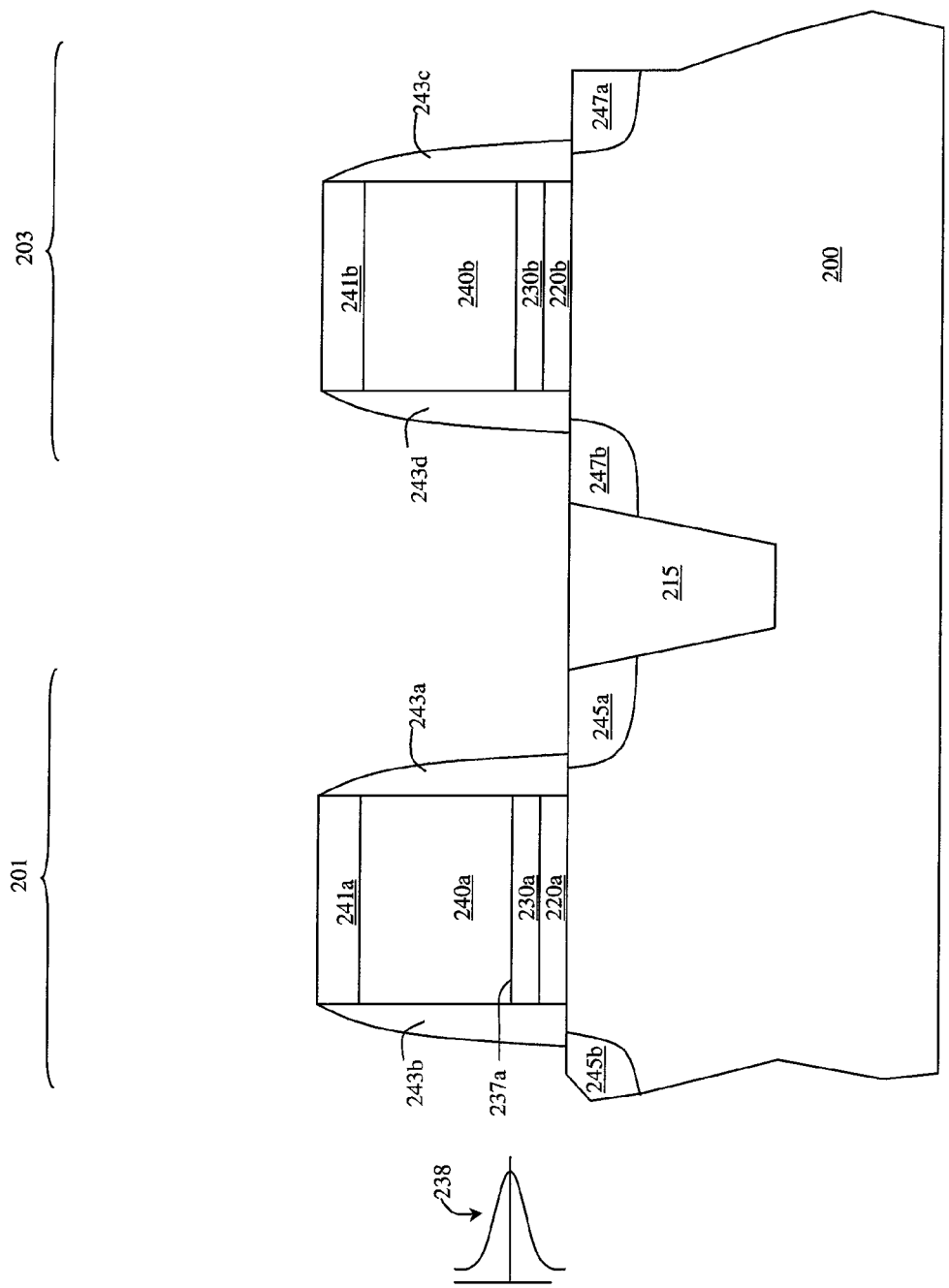

Referring to FIG. 2D, the gate dielectric structure 220, the work function metallic layer 230, the silicon layer 240, and the hard mask layer 241 (shown in FIG. 2C) can be patterned to form a first portion of the gate dielectric structure 220 (e.g., a gate dielectric structure 220a), a first portion of the work function metallic layer 230 (e.g., a work function metallic layer 230a), a first portion of the silicon layer 240 (e.g., a silicon layer 240a), and a first portion of the hard mask layer 241 (e.g., a hard mask layer 241a) and to form a second portion of the gate dielectric structure 220 (e.g., a gate dielectric structure 220b), a second portion of the work function metallic layer 230 (e.g., a work function metallic layer 230b), a second portion of the silicon layer 240 (e.g., a silicon layer 240b), and a second portion of the hard mask layer 241 (e.g., a hard mask layer 241b). The patterning process can include, for example, a photolithographic process and a dry etching. The patterning process can use a patterned PR layer (not shown) to define the patterns. The patterned PR layer can be removed after the patterning.

Referring again to FIG. 2D, spacers 243a-243d can be formed on sidewalls of the silicon layers 240a and 240b. The spacers 243a-243d may include materials such as oxide, nitride, oxynitride, and/or other dielectric material. N-type source/drain regions 245a-245b and p-type source/drain regions 247a-247b can be formed within the substrate 200. The n-type source/drain regions 245a and 245b can have dopants such as Arsenic (As), Phosphorus (P), other group V element, or the combinations thereof. The p-type source/drain regions 247a and 247b can have dopants such as Boron (B) or other group III element.

Figure 2E:
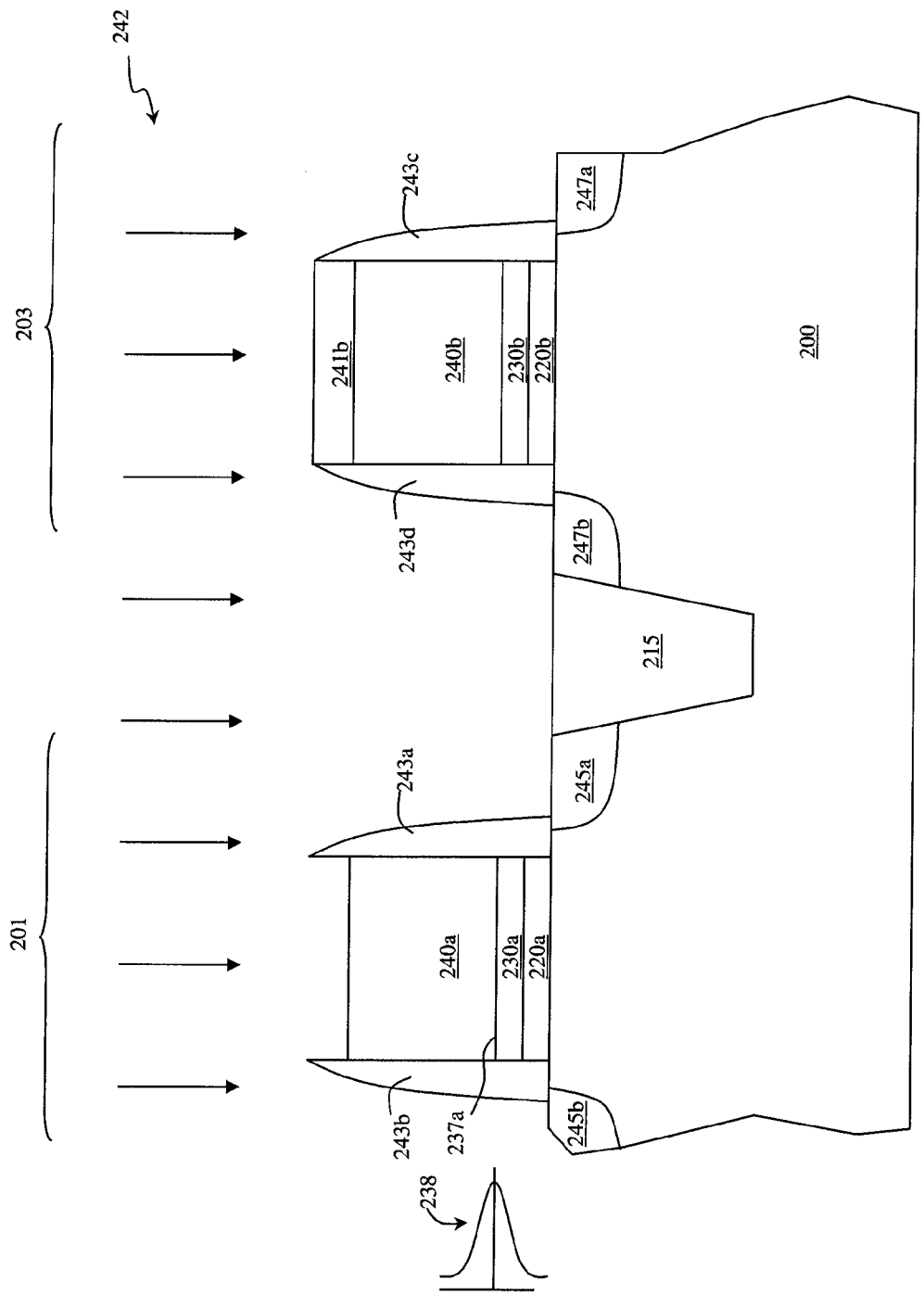

Referring to FIG. 2E, a removing process 242 can remove the hard mask layer 241a (shown in FIG. 2D) for exposing a surface (not labeled) of the silicon layer 240a. In some embodiments, a patterned PR layer (not shown) can cover the hard mask layer 241b. The patterned PR layer can protect the hard mask layer 241b from being removed while the removing process 242 removes the hard mask layer 241a. The removing process 242 can include a dry etching process, a wet etching process, or any combinations thereof.

Figure 2F:
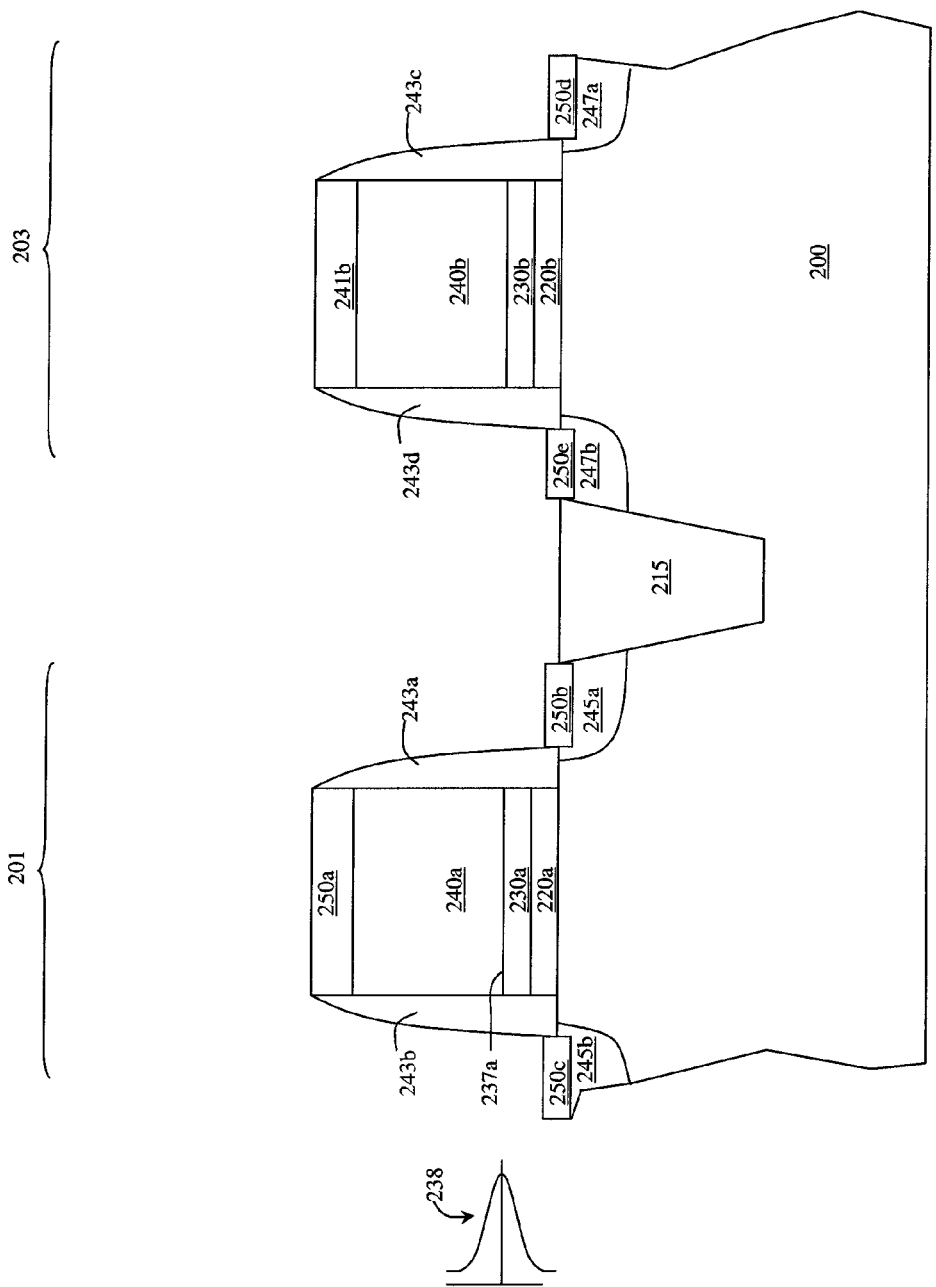

Referring to FIG. 2F, a salicidation process is performed to form silicide layers 250a-250e on the silicon layer 240a, n-type source/drain regions 245a-245b, and p-type source/drain regions 247a-247b, respectively. The hard mask layer 241b can desirably prevent the silicon layer 240b from being silicided. In some embodiments, the gate electrode of the NMOS transistor can include the work function metallic layer 230a, the silicon layer 240a, and the silicide layer 250a. The silicon layer 240b can be referred to as a dummy gate of the PMOS transistor. In some embodiments, the gate-first process described above in conjunction with FIG. 1 can include the flows described above in conjunction with FIGS. 2C-2F.

The silicide layers 250a-250e can provide low resistances. The silicide layers 250a-250e may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof. The materials utilized to create the silicide may be deposited using PVD such as sputtering and evaporation; plating; CVD such as plasma enhanced CVD (PECVD), atmospheric pressure CVD (APCVD), low pressure CVD (LPCVD), high density plasma CVD (HDPCVD)

and atomic layer CVD (ALCVD); other suitable deposition processes; and/or combinations thereof.

After deposition, the salicidation process may include a reaction between the deposited material and the doped regions at an elevated temperature that is selected based on the specific material or materials. This is also referred to as annealing, which may include a Rapid Thermal Processing (RTP). The reacted silicide may be formed by a one-step RTP or multiple-step RTPs. In some embodiments, the RTP can be performed at a temperature of about 1,000° C. or more.

Figure 2G:
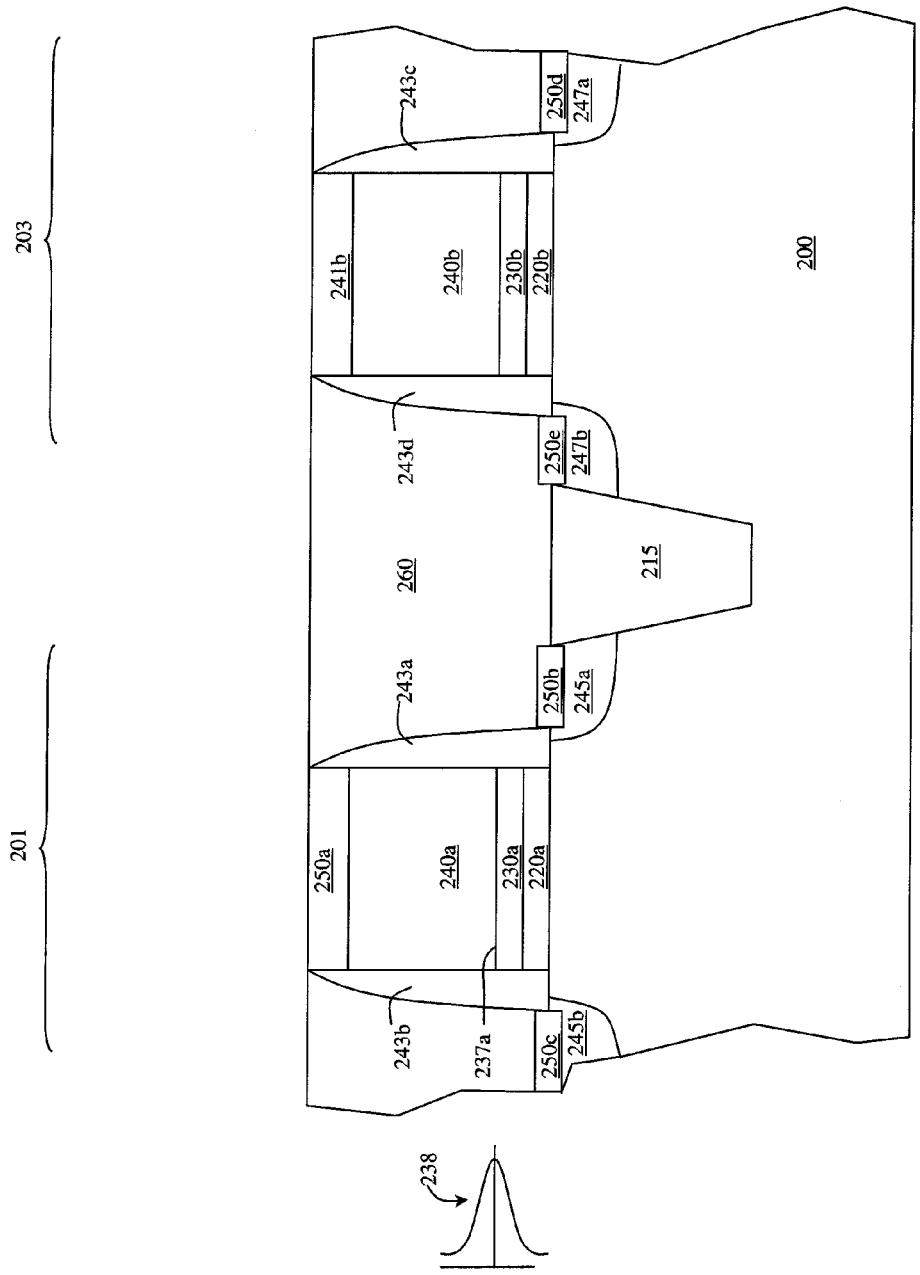

Referring to FIG. 2G, at least one dielectric layer 260 can be formed around the spacers 243a-243d. The dielectric layer 260 may include materials such as oxide, nitride, oxynitride, low-k dielectric material, ultra low-k dielectric material, extreme low-k dielectric material, other dielectric material, and/or combinations thereof. The dielectric layer 260 may be formed by, for example, a CVD process, a HDP CVD process, a HARP, a spin-coating process, other deposition process, and/or any combinations thereof. In some embodiments, the dielectric layer 260 can be referred to as an interlayer dielectric (ILD).

Figure 2H:
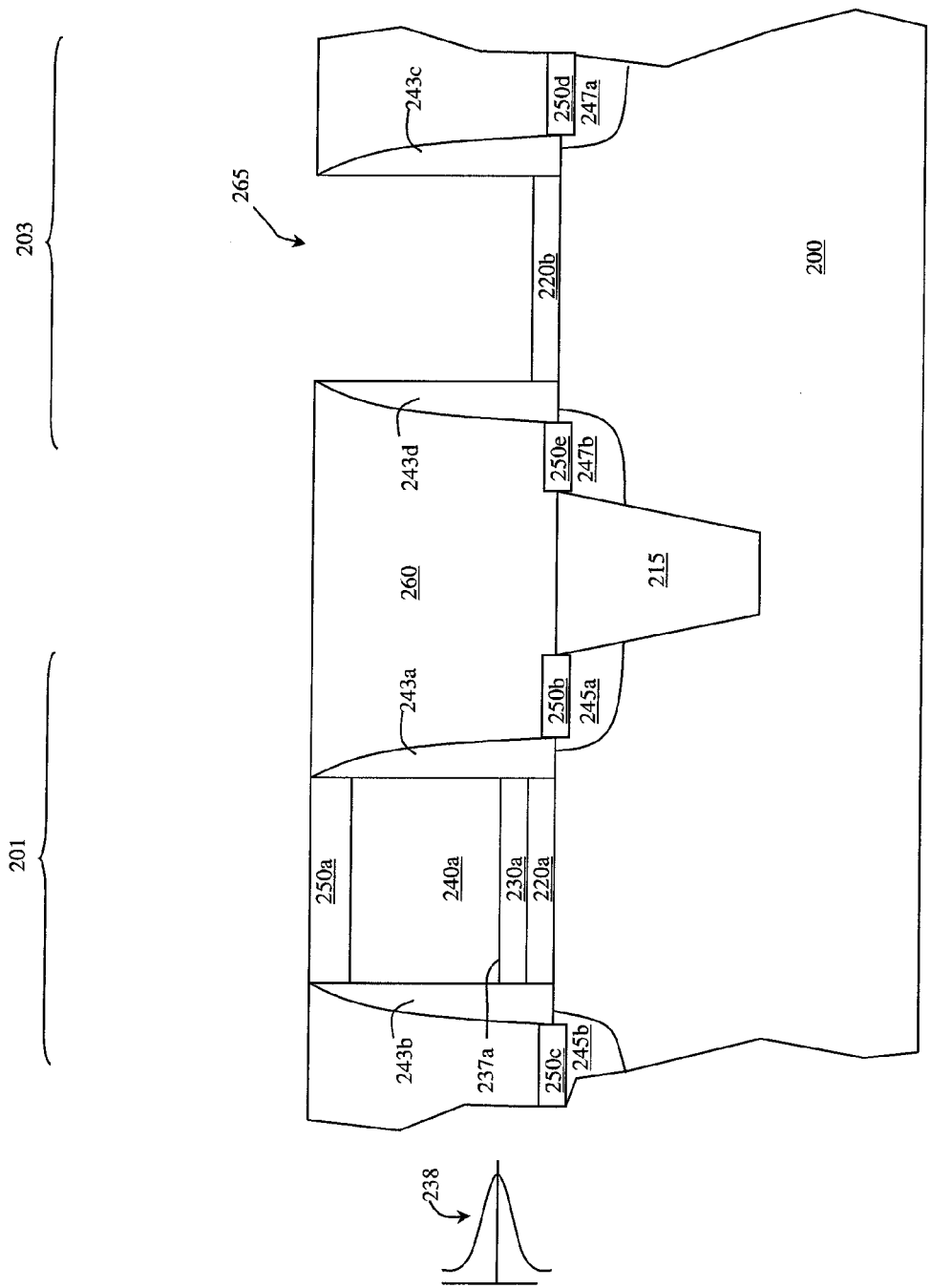

Referring to FIG. 2H, the hard mask layer 241b, the silicon layer 240b, and the work function metallic layer 230b can be removed by, for example, a wet etching process. An opening 265 can be formed between the spacers 243c and 243d. The silicide layer 250a can desirably protect the silicon layer 240a from being removed during the wet etching process.

Figure 2I:
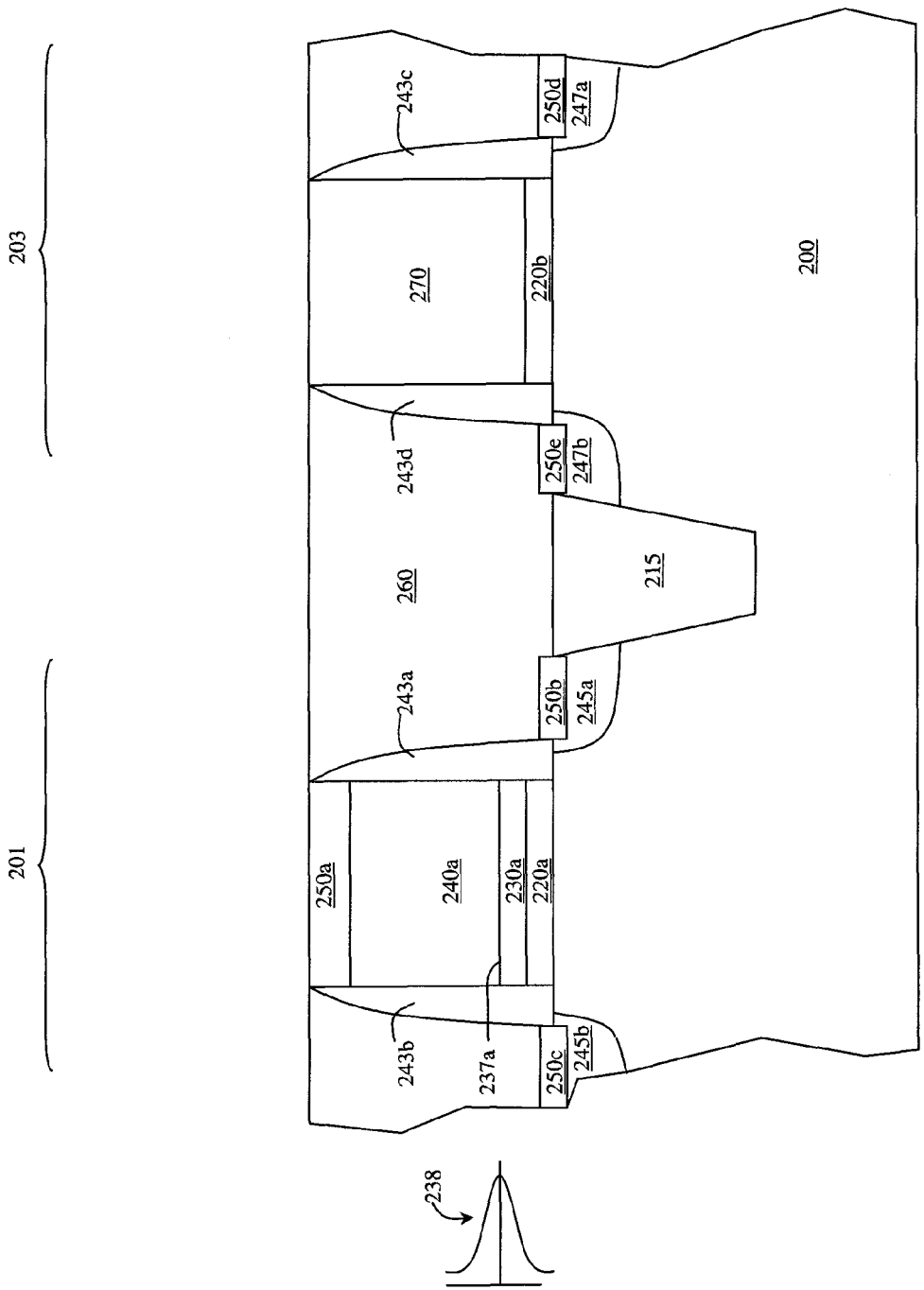

Referring to FIG. 2I, another work function metallic layer 270 can be formed in the opening 265 (shown in FIG. 2H) and over the gate dielectric structure 220b. In some embodiments, the gate electrode of the PMOS transistor can include the work function metallic layer 270. The PMOS transistor is free from including any silicide material on the work function metallic layer 270. In some embodiments, the gate-last process described above in conjunction with FIG. 1 can include the flow described above in conjunction with FIGS. 2H-2I.

The work function metallic layer 270 can include a p-type work function metallic layer or an n-type work function metallic layer. In embodiments using a p-type work function metallic layer, the work function metallic layer 270 can include materials such as metal, metal carbide, metal nitride, and/or other materials that can provide a desired work function for transistors. In some embodiments, the p-type work function metallic layer can include a material such as ruthenium, palladium, platinum, cobalt, nickel, conductive metal oxides, e.g., ruthenium oxide, other p-type metallic material that is capable of modulating the work function value of the gate electrode of the PMOS transistor, or the combinations thereof.

In some embodiments, a conductive material (not shown), e.g., aluminum (Al), copper (Cu), AlCu, titanium, titanium nitride, tantalum, tantalum nitride, other conductive material, or any combinations thereof, can be formed over the work function metallic layer 270. The conductive material can provide a desired connection between the work function metallic layer 270 and metallic layer (not shown). In some embodiments, the conductive material can be referred to as a fill-in metallic material that can be filled in a gap (not shown) in the work function metallic layer 270.

Figure 3:
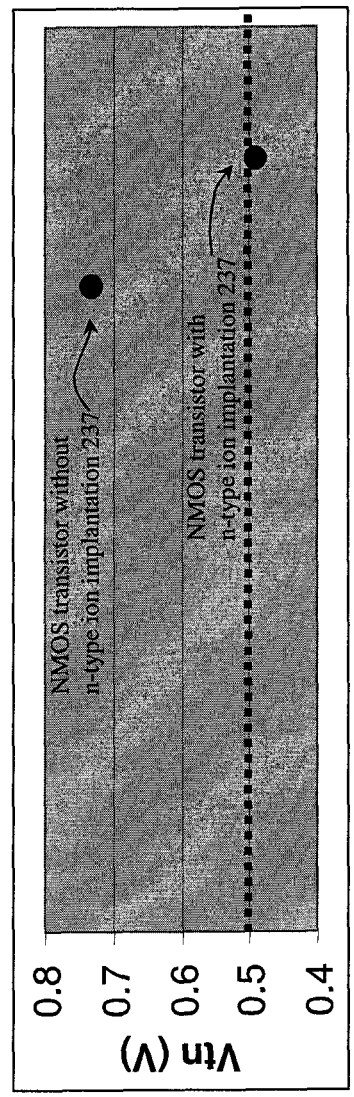
FIG. 3 is a schematic drawing illustrating threshold voltages of NMOS transistors with and without n-type ion implantation.

FIG. 3 is a schematic drawing illustrating threshold voltages of NMOS transistors with and without n-type ion implantation according to some embodiments. In FIG. 3, the NMOS transistor without the n-type ion implantation 237 can have a threshold voltage of about 0.73 V. In contrast, the NMOS transistor with the n-type ion implantation 237 can have a threshold voltage of about 0.49 V. The n-type ion implantation 237 can desirably lower the threshold voltage of the NMOS transistor.

Figure 4A:
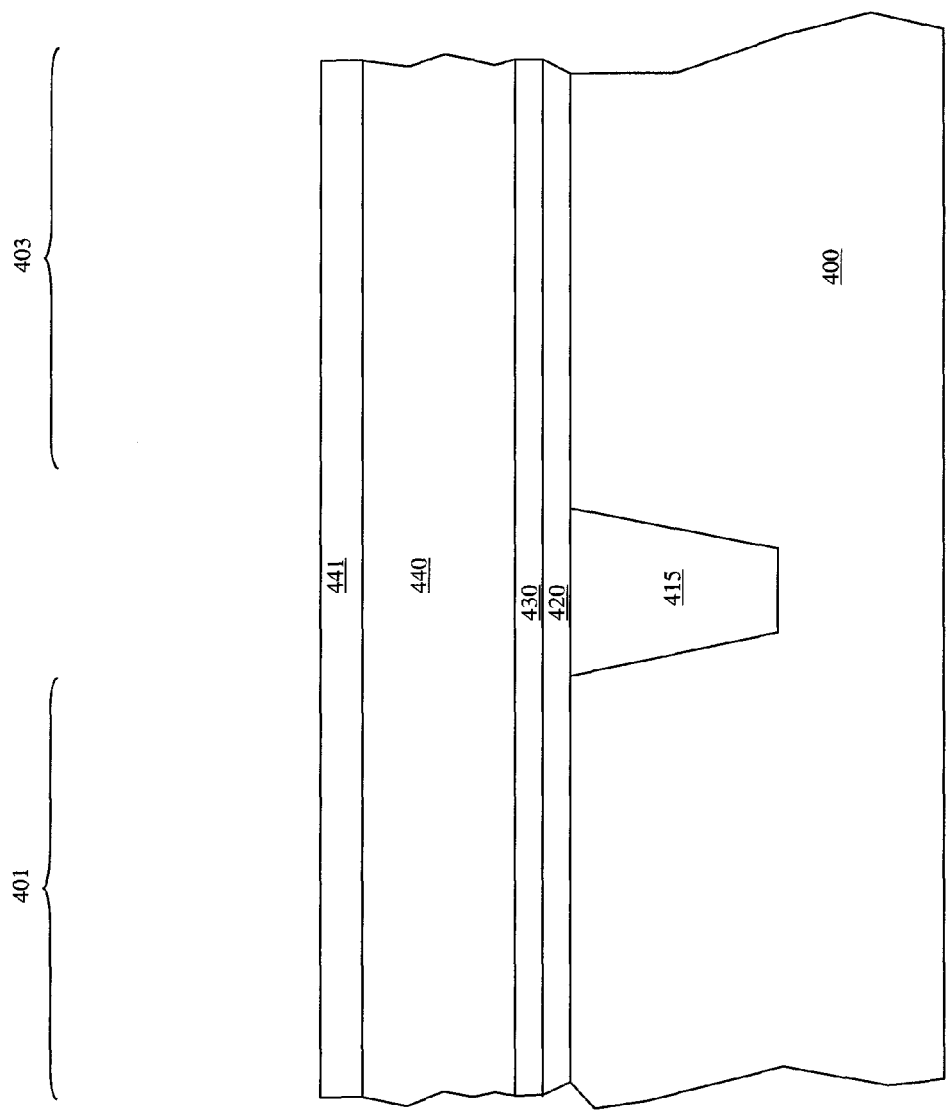

FIGS. 4A-4G are schematic cross-sectional views illustrating another exemplary method of forming an integrated circuit. In this embodiment, the work function values of the NMOS transistor and PMOS transistor can be adjusted by using work function metallic layers having different thickness. Items of FIGS. 4A-4G that are similar or the same items in FIGS. 2A-2I are indicated by the same reference numerals, increased by 200. In FIG. 4A, an isolation structure 415 can be formed within a substrate 400. A gate dielectric structure 420, a work function metallic layer 430, a silicon layer 440, and a hard mask layer 441 can be sequentially formed over the substrate 400. In some embodiments, the work function metallic layer 430 can have a thickness of about 3 nm or less.

Referring to FIG. 4B, the gate dielectric structure 420, the work function metallic layer 430, the silicon layer 440, and the hard mask layer 441 can be patterned to form a first portion of the gate dielectric structure 420 (e.g., a gate dielectric structure 420a), a first portion of the work function metallic layer 430 (e.g., a work function metallic layer 430a), a first portion of the silicon layer 440 (e.g., a silicon layer 440a), and a first portion of the hard mask layer 441 (e.g., a hard mask layer 441a) and to form a second portion of the gate dielectric structure 420 (e.g., a gate dielectric structure 420b), a second portion of the work function metallic layer 430 (e.g., a work function metallic layer 430b), a second portion of the silicon layer 440 (e.g., a silicon layer 440b), and a second portion of the hard mask layer 441 (e.g., a hard mask layer 441b).

Spacers 443a-443d can be formed on sidewalls of the silicon layers 440a and 440b. The spacers 443a-443d may include materials such as oxide, nitride, oxynitride, and/or other dielectric material. N-type source/drain regions 445a-445b and p-type source/drain regions 447a-447b can be formed within the substrate 400. The n-type source/drain regions 445a and 445b can have dopants such as Arsenic (As), Phosphorus (P), other group V element, or the combinations thereof. The p-type source/drain regions 447a and 447b can have dopants such as Boron (B) or other group III element.

Figure 4C:
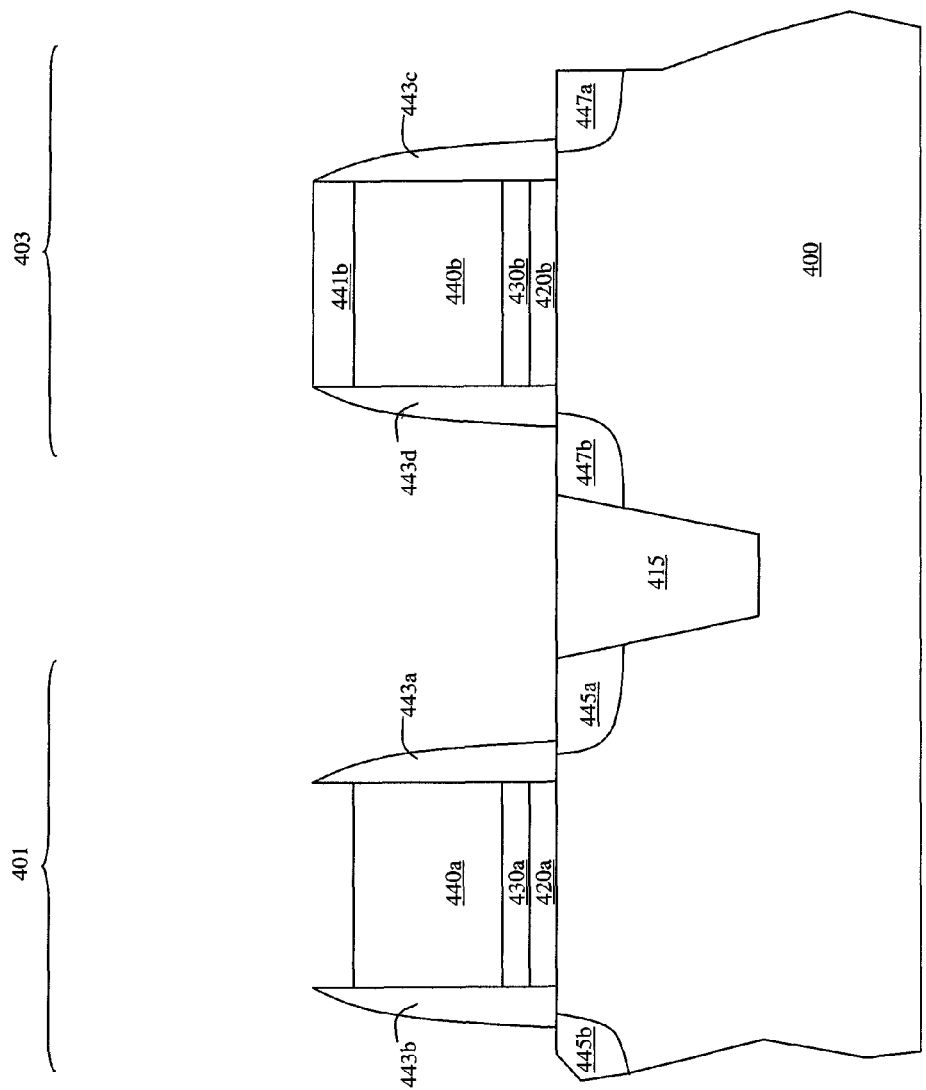

Referring to FIG. 4C, the hard mask layer 441a is removed for exposing a surface (not labeled) of the silicon layer 440a. In some embodiments, a patterned PR layer (not shown) can cover the hard mask layer 441b. The patterned PR layer can protect the hard mask layer 441b from being removed while the process removes the hard mask layer 441a. The process removing the hard mask layer 441a can include a dry etching process, a wet etching process, or any combinations thereof.

Figure 4D:
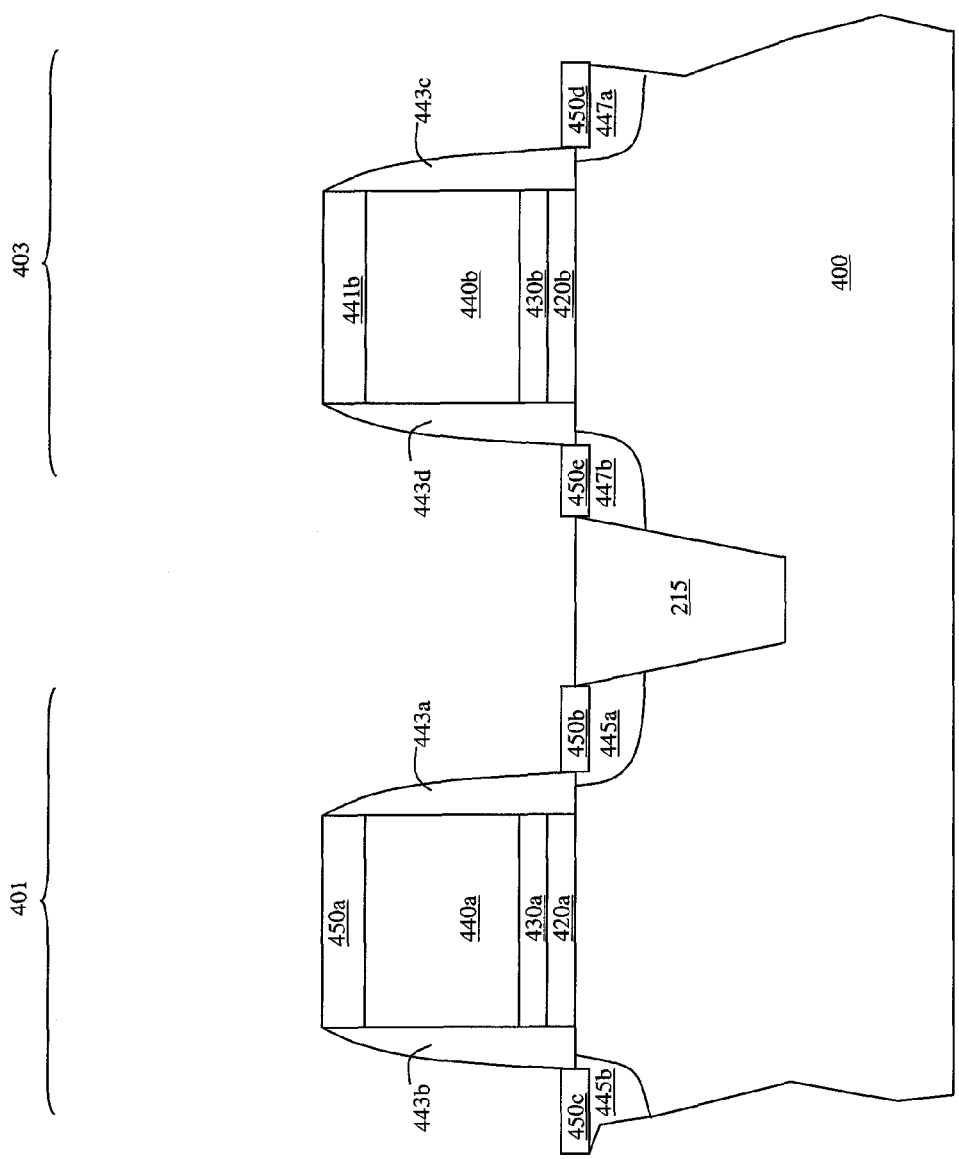

Referring to FIG. 4D, a salicidation process is performed to form silicide layers 450a-450e on the silicon layer 440a, the n-type source/drain regions 445a-445b, and the p-type source/drain regions 447a-447b, respectively. The hard mask layer 441b can desirably prevent a silicide layer formed on the silicon layer 440b. In some embodiments, the electrode of the NMOS transistor can include the work function metallic layer 430a, the silicon layer 440a, and the silicide layer 450a. The silicon layer 440b can be referred to as a dummy gate of the PMOS transistor.

Figure 4E:
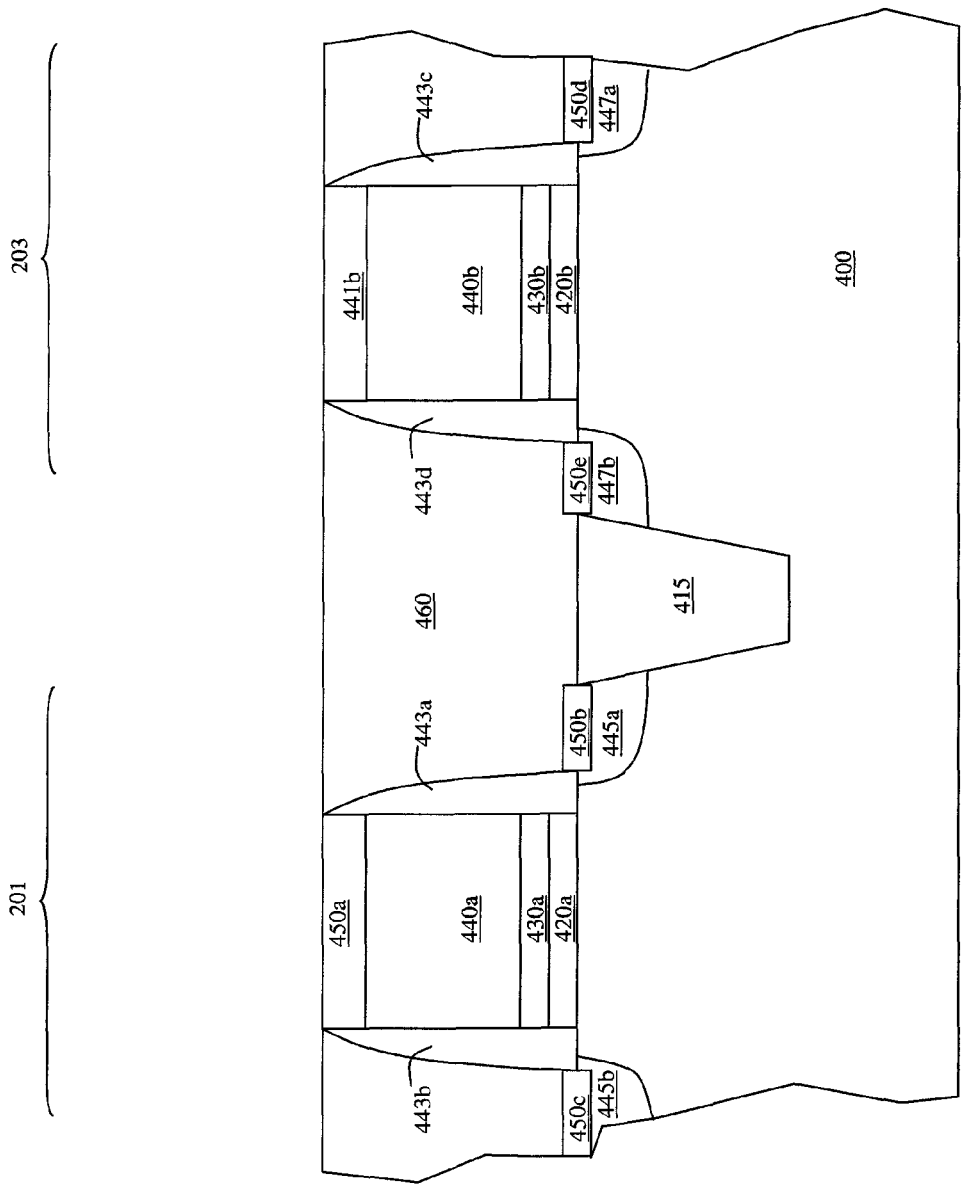

Referring to FIG. 4E, at least one dielectric layer 460 can be formed around the spacers 443a-443d. The dielectric layer 460 may include materials such as oxide, nitride, oxynitride, low-k dielectric material, ultra low-k dielectric material, extreme low-k dielectric material, other dielectric material, and/or combinations thereof. The dielectric layer 460 may be formed by, for example, a CVD process, a HDP CVD process, a HARP, a spin-coating process, other deposition process, and/or any combinations thereof. In some embodiments, the dielectric layer 460 can be referred to as an interlayer dielectric (ILD).

Figure 4F:
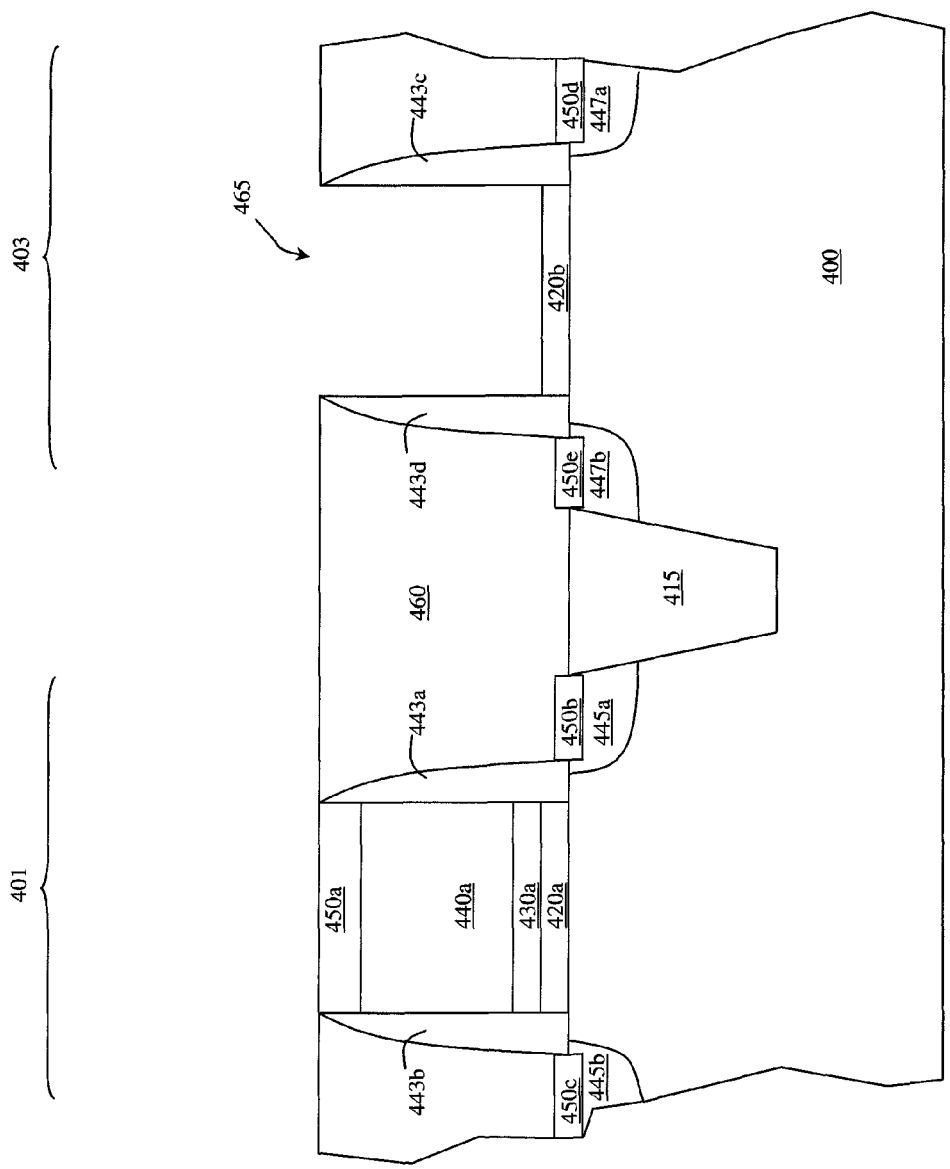

Referring to FIG. 4F, the hard mask layer 441b, the silicon layer 440b, and the work function metallic layer 430b can be removed by, for example, a wet etching process. An opening 465 can be formed between the spacers 443c and 443d. The silicide layer 450a can desirably protect the silicon layer 440a from being removed during the wet etch process.

Figure 4G:
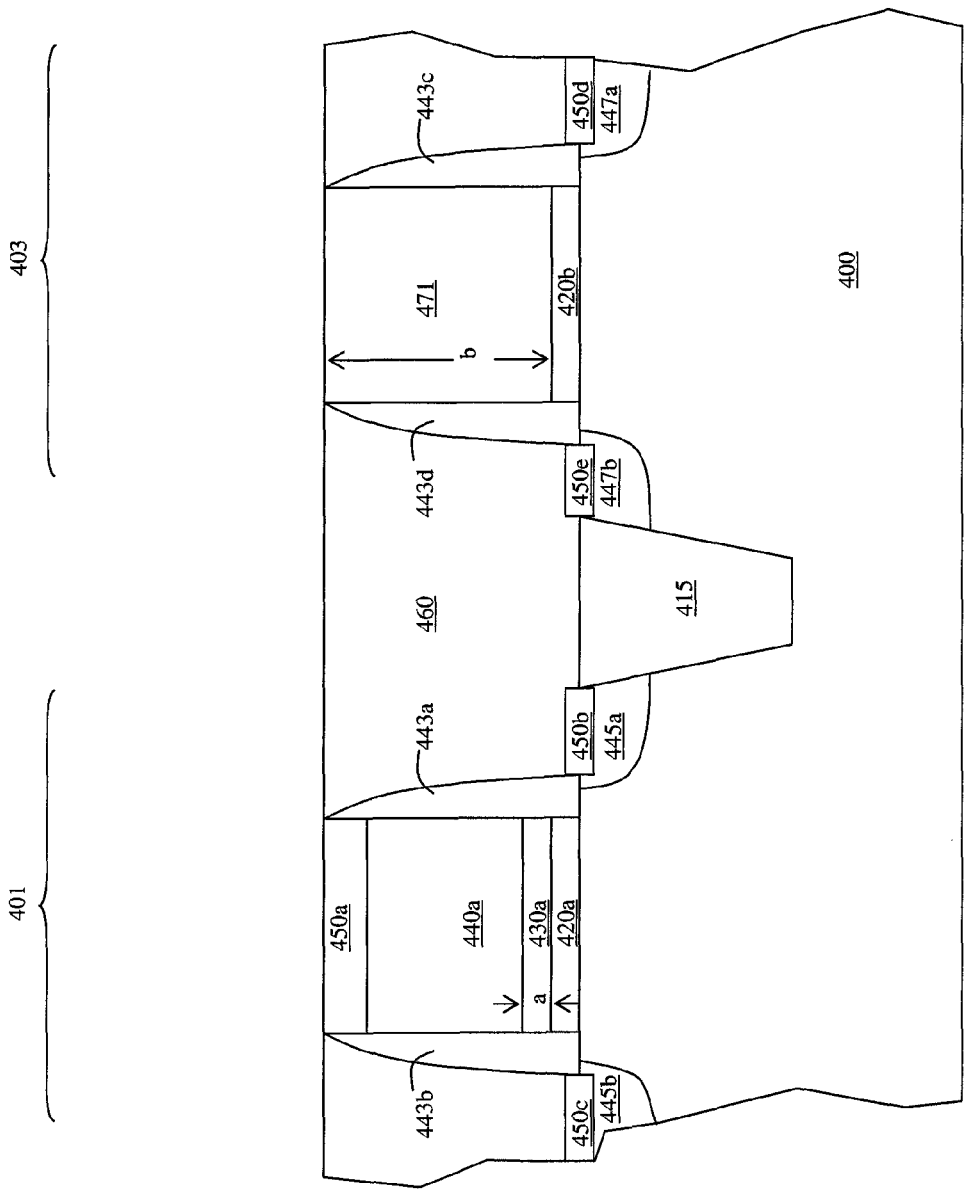

Referring to FIG. 4G, another work function metallic layer 471 can be formed in the opening 465 (shown in FIG. 4F) and over the gate dielectric structure 420b. The gate electrode of the PMOS transistor can include the work function metallic layer 471. The PMOS transistor is free from including any silicide material on the work function metallic layer 471.

In some embodiments, the work function metallic layer 471 can have the same type work function metallic material as the work function metallic layer 430a. For example, both of the work function metallic layers 471 and 430a have n-type work function metallic material. In some other embodiments, the work function metallic layer 471 can have the same work function metallic material as the work function metallic layer 440a. In still other embodiments, both of the work function metallic layers 471 and 430a include titanium nitride (TiN).

Referring again to FIG. 4G, in some embodiments, the work function metallic layer 430a can have a thickness "a" of about 3 nm or less. The work function metallic layer 471 can have a thickness "b" of about 8 nm or more. It is found that the thicknesses of the work function metallic layers 430a and 471 can affect the work function values of the NMOS transistor and PMOS transistor, respectively. If the thickness of the work function metallic layer 430a is reduced, the work function value of the NMOS transistor can be lowered to about, e.g., 0.5 V. If the thickness of the work function metallic layer 471 is increased, the work function value of the PMOS transistor can be increased to about, e.g., −0.5 V.

Figure 5:
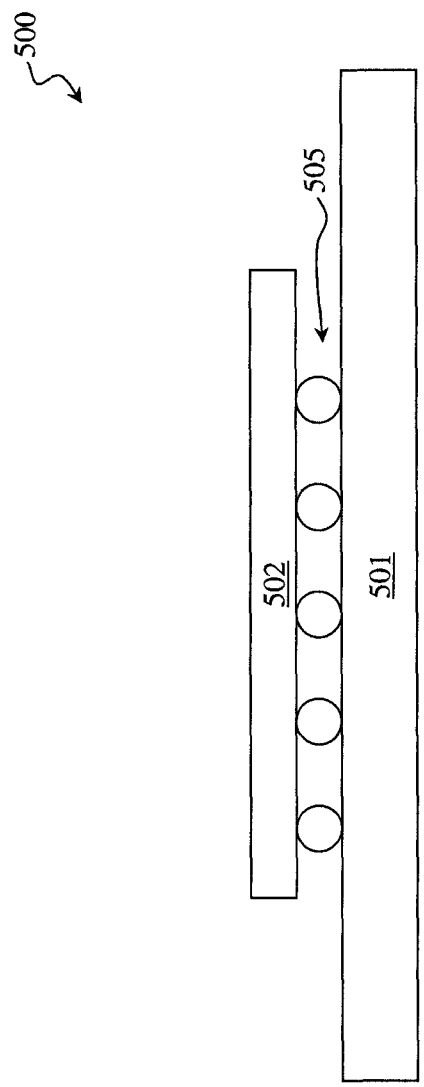
FIG. 5 is a schematic drawing illustrating a system including an exemplary integrated circuit disposed over a substrate board.

FIG. 5 is a schematic drawing illustrating a system including an exemplary integrated circuit disposed over a substrate board. In FIG. 5, a system 500 can include an integrated circuit 502 disposed over a substrate board 501. The substrate board 501 can include a printed circuit board (PCB), a printed wiring board and/or other carrier that is capable of carrying an integrated circuit. The integrated circuit 502 can include the NMOS transistor and PMOS transistor described above in conjunction with FIGS. 2I and 4G. The integrated circuit 502 can be electrically coupled with the substrate board 501. In some embodiments, the integrated circuit 502 can be electrically coupled with the substrate board 501 through bumps 505. In some other embodiments, the integrated circuit 502 can be electrically coupled with the substrate board 501 through wire bonding. The system 500 can be part of an electronic system such as computers, wireless communication devices, computer-related peripherals, entertainment devices, or the like.

In some embodiments, the system 500 including the integrated circuit 502 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
   forming a metallic gate electrode of an NMOS transistor and a dummy gate electrode of a PMOS transistor over a substrate;
   forming a dielectric layer surrounding the metallic gate electrode of the NMOS transistor and the dummy gate electrode of the PMOS transistor after the forming the metallic gate electrode of the NMOS transistor and the dummy gate electrode of the PMOS transistor;
   removing the dummy gate electrode of the PMOS transistor to form an opening after the formation of the dielectric layer; and
   forming a gate electrode of the PMOS transistor over the substrate within the opening;
   wherein the forming the metallic gate electrode of the NMOS transistor comprises:
   forming a first gate dielectric structure over the substrate;
   forming a first work function metallic layer over the first gate dielectric structure;
   forming a first silicon layer over the first work function metallic layer; and
   forming a silicide layer over the first silicon layer before forming the gate electrode of the PMOS transistor.

2. The method of claim 1, further comprising:
   forming an amorphous silicon layer on the first work function metallic layer; and
   implanting n-type dopants to an interface between the amorphous silicon layer and the first work function metallic layer for lowering a work function value of the first work function metallic layer.

3. The method of claim 2, wherein implanting n-type dopants has an implantation dosage from about $1E15/cm^2$ to about $9E15/cm^2$.

4. The method of claim 1, wherein the forming the gate electrode of the PMOS transistor within the opening comprises:
   forming a second gate dielectric structure over the substrate; and
   forming a second work function metallic layer over the second gate dielectric structure, wherein the gate-last process is free from including forming any silicide material on the second work function metallic layer.

5. The method of claim 4, wherein forming the second work function metallic layer comprises:
   forming a third work function metallic layer over the second gate dielectric structure;
   forming a second silicon layer over the third work function metallic layer;
   forming a dielectric layer around the third work function metallic layer and the second silicon layer;
   substantially removing the third work function metallic layer and the second silicon layer to form an opening; and
   filling the second work function metallic layer in the opening.

6. The method of claim 4, wherein the first work function metallic layer and the second work function metallic layer have the same work function metallic material and the second work function metallic layer is thicker than the first metallic material.

7. The method of claim 6, wherein the second work function metallic layer has a thickness of about 8 nm or more and the first work function metallic layer has a thickness of about 3 nm or less.

8. A method of forming an integrated circuit, the method comprising:
   forming a gate dielectric structure over a substrate;
   forming a first work function metallic layer over the gate dielectric structure;
   forming a silicon layer over the first work function metallic layer;
   forming a mask layer over the silicon layer;
   patterning the gate dielectric structure, the first work function metallic layer, the silicon layer, and the mask layer to form a first portion of the gate dielectric structure, a first portion of the first work function metallic layer, a first portion of the silicon layer, and a first portion of the mask layer for an NMOS transistor and to form a second portion of the gate dielectric structure, a second portion of the first work function metallic layer, a second portion of the silicon layer, and a second portion of the mask layer for a PMOS transistor;
   removing the first portion of the mask layer for exposing a surface of the first portion of the silicon layer;
   siliciding the surface of the first portion of the silicon layer;
   forming a dielectric layer around the second portion of the first work function metallic layer, the second portion of the silicon layer, and the second portion of the mask layer for a PMOS transistor;
   removing the second portion of the mask layer for exposing a surface of the second portion of the silicon layer;
   substantially removing the second portion of the silicon layer and the second portion of the first work function metallic layer for forming an opening; and
   forming a second work function metallic layer in the opening.

9. The method of claim 8 further comprising:
   forming an amorphous silicon layer on the first work function metallic layer;
   forming a patterned photoresist (PR) layer over the amorphous silicon layer, covering a region of the PMOS transistor; and
   using the patterned PR layer as a mask for implanting n-type dopants to an interface between the amorphous silicon layer and the first work function metallic layer for lowering a work function value of the first work function metallic layer.

10. The method of claim 9, wherein implanting n-type dopants has an implantation dosage from about 1E15/cm2 to about 9E15/cm2.

11. The method of claim 8, wherein the first work function metallic layer and the second work function metallic layer have the same metallic material and the second work function metallic layer is thicker than the first metallic material.

12. The method of claim 11, wherein the second work function metallic layer has a thickness of about 8 nm or more and the first work function metallic layer has a thickness of about 3 nm or less.

* * * * *